(12) United States Patent
Tseng et al.

(10) Patent No.: US 11,493,961 B2
(45) Date of Patent: Nov. 8, 2022

(54) DOCKING STATION

(71) Applicant: BIZLINK INTERNATIONAL CORPORATION, New Taipei (TW)

(72) Inventors: Kuo-Liang Tseng, New Taipei (TW); Yu-Shih Chin, Taipei (TW)

(73) Assignee: BIZLINK INTERNATIONAL CORPORATION, New Taipei (TW)

( * ) Notice: Subject to any disclaimer, the term of this patent is extended or adjusted under 35 U.S.C. 154(b) by 0 days.

(21) Appl. No.: 17/177,171

(22) Filed: Feb. 16, 2021

(65) Prior Publication Data

US 2021/0263559 A1 Aug. 26, 2021

(51) Int. Cl.
*G06F 1/16* (2006.01)

(52) U.S. Cl.
CPC .................................. *G06F 1/1632* (2013.01)

(58) Field of Classification Search
CPC .... G06F 1/1632; H05K 7/20127; H01R 27/00
See application file for complete search history.

(56) References Cited

U.S. PATENT DOCUMENTS

| | | | | |
|---|---|---|---|---|
| 2007/0135157 | A1* | 6/2007 | Kuo | H01Q 7/00 455/550.1 |
| 2014/0268542 | A1* | 9/2014 | Moon | H01R 13/44 361/679.41 |
| 2015/0162767 | A1* | 6/2015 | Oh | H02J 7/0044 320/108 |
| 2016/0259374 | A1* | 9/2016 | Breiwa | H01F 38/14 |
| 2018/0284842 | A1* | 10/2018 | Han | H04M 1/04 |
| 2018/0288898 | A1* | 10/2018 | Jeong | H02J 7/0027 |
| 2021/0161034 | A1* | 5/2021 | Jeong | H02J 7/00309 |

* cited by examiner

*Primary Examiner* — Rockshana D Chowdhury
(74) *Attorney, Agent, or Firm* — Birch, Stewart, Kolasch & Birch, LLP

(57) ABSTRACT

A docking station has a base, a main casing, a cover body, a ventilation layer, and multiple first lateral openings. The main casing forms a first inner space and has multiple first through-holes. The ventilation layer is in gaseous communication with the first inner space via the first through-holes. The cover body is fixed to the main casing, and the ventilation layer is formed between the cover body and the main casing. The first lateral openings are formed in the cover body and in gaseous communication with the ventilation layer. When in use, heat generated by electronic components inside the first inner space makes air inside the first inner space flow upwards to the ventilation layer and subsequently exits the docking station via the first lateral openings. Meanwhile, cool air enters the first inner space via the first lateral openings to dissipate heat.

18 Claims, 7 Drawing Sheets

DOCKING STATION

CROSS-REFERENCE TO RELATED APPLICATIONS

This application claims the benefit of and priority to Taiwan Application No. 109201870, filed on Feb. 20, 2020, the disclosure of which is incorporated herein in its entirety by reference.

BACKGROUND OF THE INVENTION

Field of the Invention

The present invention relates to a docking station, especially to a docking station that is capable of connecting to connectors of different specifications.

Description of the Prior Arts

Conventional docking stations are used for connecting electronic equipment. Therefore, multiple electronic components are mounted inside the docking station. One type of the docking stations is made portable by putting all the components inside a relatively small case. However, the electronic components generate heat when operating, and the docking station with smaller inner space lacks sufficient space for forming an air circulation channel. As a result, heat dissipation capacity of the docking station is insufficient. Moreover, the portable docking station does not have space for mounting cooling fins or cooling fans, and therefore cannot dissipate heat away effectively.

On the other hand, the electronic components in the portable docking station are very close to the case, causing heat of the electronic components to be transferred directly to areas of the case that are adjacent to said components. In other words, surface temperatures of the docking station differ enormously. While temperatures of some areas are at room temperature, temperatures of some other areas are intolerably high for a user. This is another expression of poor heat dissipation.

To overcome the shortcomings, the present invention provides an improved docking station to mitigate or obviate the aforementioned problems.

SUMMARY OF THE INVENTION

The main objective of the present invention is to provide a docking station that is configured for being connected to at least one electronic device, and a space allowing air circulation formed inside the docking station to reduce temperature and to equalize the surface temperature of the docking station.

The docking station is used for being connected to an electronic device and has a base, a main casing, a cover body, and multiple first lateral openings. The main casing is fixed to the base. A first inner space is formed in the main casing. The main casing has a first surface, multiple first through-holes, and at least one first side surface. The first through-holes are formed on the first surface and in gaseous communication with the first inner space. Each one of the at least one first side surface is connected to an edge of the first surface. The at least one first side surface has at least one connecting hole formed through the at least one first side surface. Each one of the at least one connecting hole is used for being connected to the electronic device. The cover body is fixed on the first surface. A ventilation layer is formed between the cover body and the first surface, and the ventilation layer is in gaseous communication with the first inner space of the main casing via the first through-holes. The first lateral openings are formed on the cover body and in gaseous communication with the ventilation layer.

Therefore, the advantages of the present invention are that the ventilation layer is in gaseous communication with the first inner space of the main casing via the first through-holes such that heat generated by electronic components inside the first inner space makes air inside the first inner space flow upwards to the ventilation layer and subsequently exits the docking station via the first lateral openings. In other words, natural air convection paths are formed inside the docking station to dissipate the heat, which is generated by the electronic components in the docking station, away from the docking station such that temperatures of the external surface of the docking station and the electronic components inside the docking station can be reduced effectively. Moreover, heat can be distributed evenly among the cover body by air moving inside the ventilation layer.

Other objectives, advantages and novel features of the invention will become more apparent from the following detailed description when taken in conjunction with the accompanying drawings.

DETAILED DESCRIPTION OF THE PREFERRED EMBODIMENTS

Figure 1:
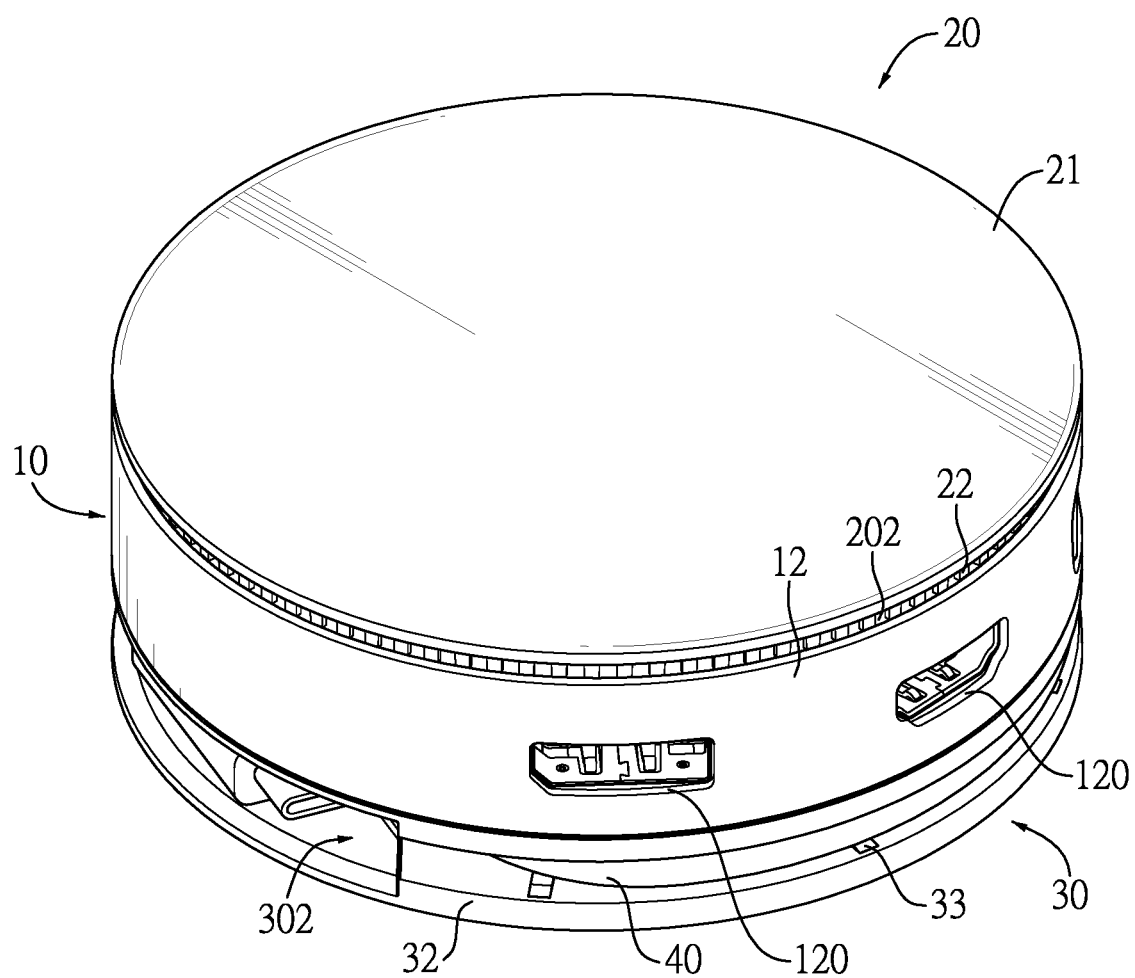
FIG. 1 is a perspective view of a docking station in accordance with the present invention.

With reference to FIG. 1, a docking station in accordance with the present invention is capable of being connected to multiple electronic devices. To be specific, the docking station in accordance with the present invention has a main casing 10, a cover body 20 (a.k.a. a cover), a base 30, and a cable 40. Multiple electronic components can be mounted in the main casing 10 and the base 30, and the cable 40 is used for connecting an electronic device.

Figure 2:
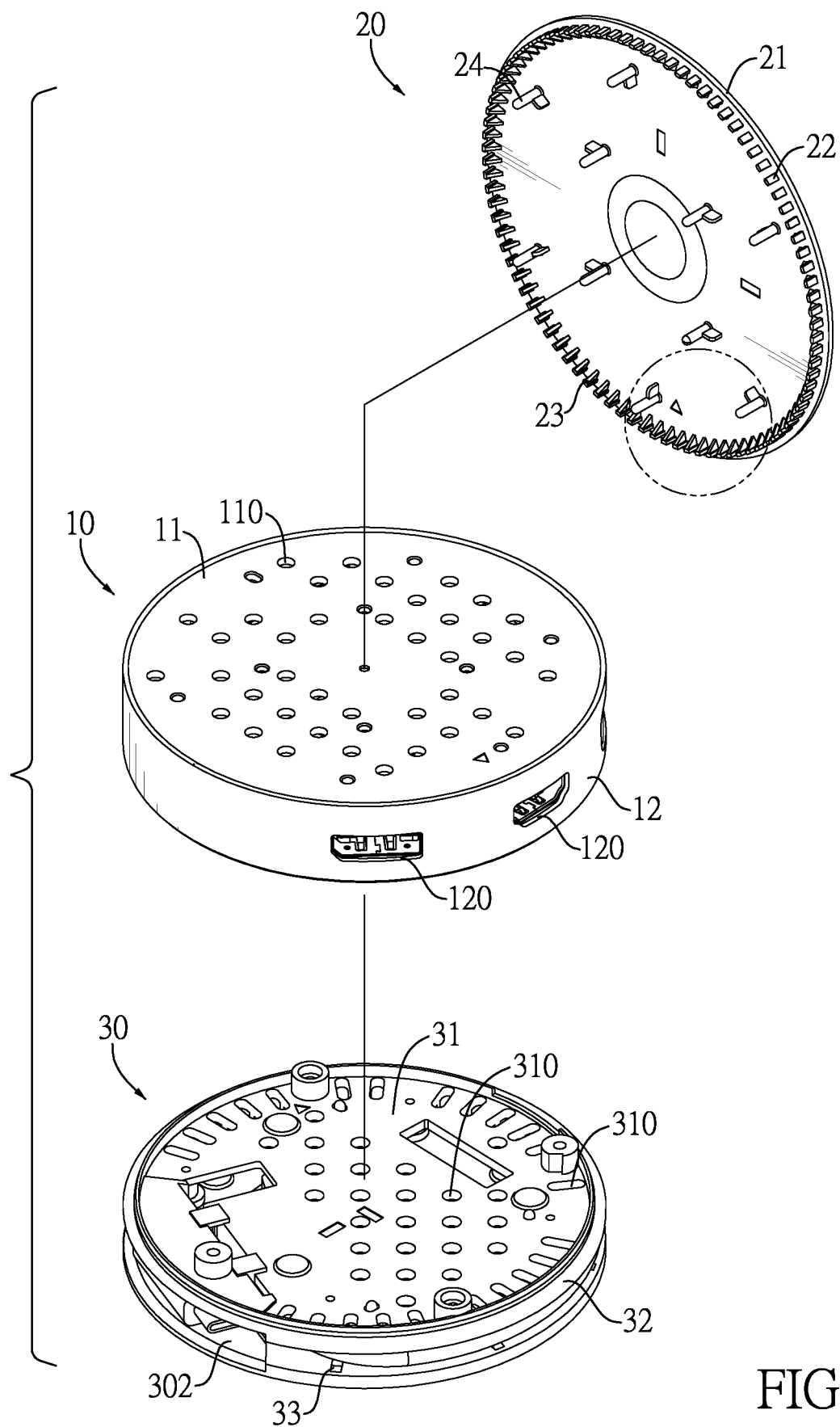
FIG. 2 is an exploded view of the docking station in FIG. 1.
Figure 5:
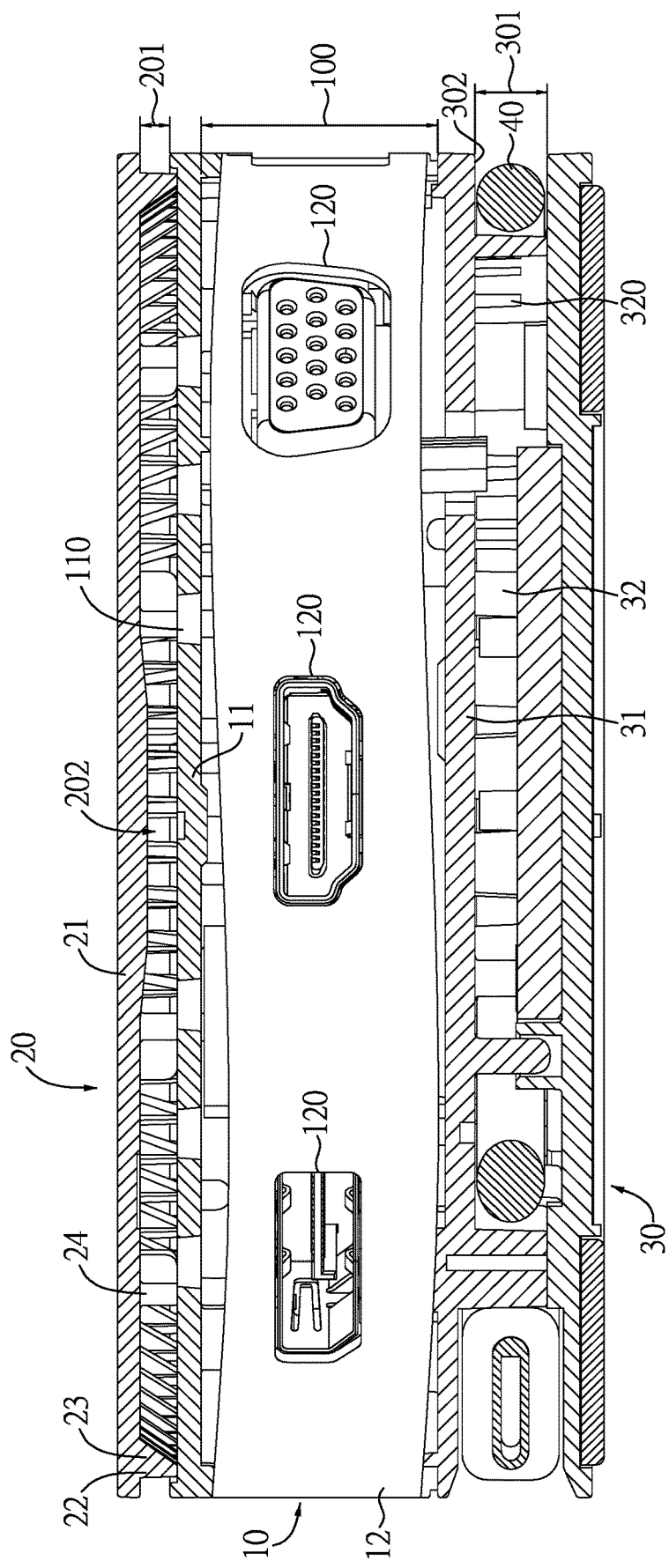
FIG. 5 is a sectional view of the docking station, showing the docking station cut across a cutting plane line 5-5 in FIG. 4.

With reference to FIGS. 1, 2, and 5, a first inner space 100 for accommodating the electronic components is formed in the main casing 10. The main casing 10 has a first surface 11 and at least one first side surface 12, and the at least one first side surface 12 is connected to an edge of the first surface 11. In a preferred embodiment, the first surface 11 can be a round surface such that the main casing 10 correspondingly has only one first side surface 12. To be specific, the first side surface 12 is an annular surface surrounding the first surface 11 and connected to the edge of the first surface 11.

Multiple first through-holes 110 are formed on the first surface 11 and in gaseous communication with the first inner space 100. The first through-holes 110 can be randomly distributed on the first surface 11, or the first through-holes 110 can be aligned with the electronic components in the first inner space 100.

The first side surface 12 has at least one connecting hole 120 (a.k.a. a through hole) which is formed through the first side surface 12. In the preferred embodiment, the first side surface 12 has multiple connecting holes 120, and each one of the connecting holes 120 is used for being connected to one of the electronic devices.

Figure 3:
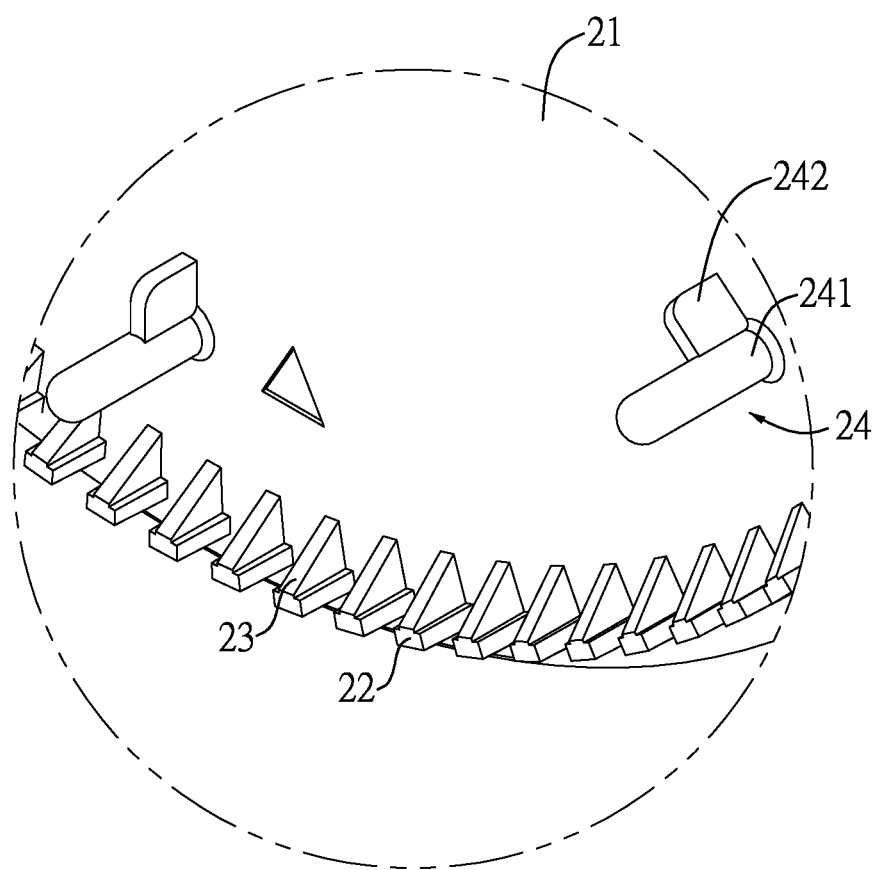
FIG. 3 is a partial enlarged view of a cover body in FIG. 1.
Figure 4:
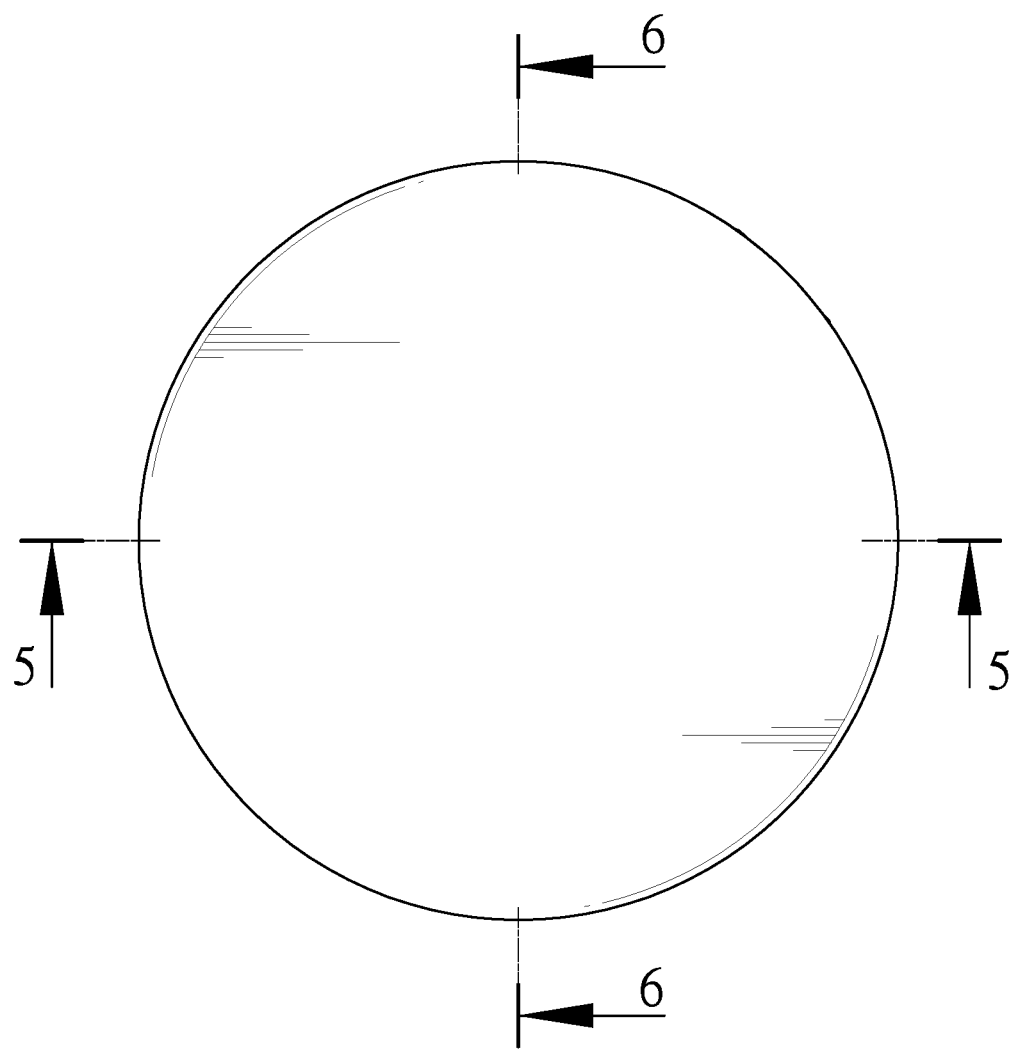
FIG. 4 is a top view of the docking station in FIG. 1.

With further reference to FIG. 3, the cover body 20 is fixed to the main casing 10 and covers the first surface 11. The cover body 20 has a covering plate 21 (a.k.a. a top plate) and multiple connecting rods 22 (a.k.a. rod-shaped structures), and preferably has multiple reinforcing ribs 23 and at least one parting member 24.

The covering plate 21 covers the first surface 11. The covering plate 21 is parallel to and disposed apart from the first surface 11, and a distance between the covering plate 21 and the first surface 11 ranges from 1 millimeter to 5 millimeters. Therefore, a ventilation layer 201 is formed between the covering plate 21 and the first surface 11, and the ventilation layer 201 is in gaseous communication with the first inner space 100 of the main casing 10 via the first through-holes 110.

In the preferred embodiment, the first surface 11 of the main casing 10 and the covering plate 21 of the cover body 20 are round, and the edge of the first surface 11 is aligned with an edge of the covering plate 21.

Each one of the connecting rods 22 has a first end and a second end. Said first end is fixed to the covering plate 21, and said second end is fixed to the main casing 10. Therefore, a first lateral opening 202 is formed among the covering plate 21, the first surface 11, and any two adjacent ones of the connecting rods 22. In other words, the docking station has multiple first lateral openings 202 in gaseous communication with the ventilation layer 201. The reinforcing ribs 23 are located in the ventilation layer 201. Each one of the reinforcing ribs 23 is connected to the covering plate 21 and one of the connecting rods 22.

In the preferred embodiment, multiple parting members 24 are located in the ventilation layer 201. The covering plate 21 and the first surface 11 of the main casing 10 are disposed apart by the parting members 24.

Each one of the parting members 24 has a positioning portion 241 and a laterally extending portion 242. The positioning portion 241 has a first end and a second end that are disposed opposite to each other. Said first end is fixed to the covering plate 21, and said second end is mounted through the first surface 11 of the main casing 10.

The laterally extending portion 242 is connected to the positioning portion 241 and has a first side and a second side that are opposite to each other. Said first side is connected to the covering plate 20, and said second side abuts against the first surface 11 of the main casing 10. Therefore, the parting members 24 can be used for supporting structure of the covering plate 21 to maintain the distance between the covering plate 21 and the first surface 11 of the main casing 10.

With reference to FIGS. 2 to 6, the main casing 10 is fixed on the base 30. A second inner space 301 is formed in the base 30, and an accommodating recess 302 is formed on an exterior surface of the base 30. A cable 40 is selectively accommodated in the accommodating recess 302.

The base 30 preferably has a second surface 31 and at least one second side surface 32. Each of the at least one second side surface 32 is connected to an edge of the second surface 31, and the accommodating recess 302 is formed on the second side surface 32.

In the preferred embodiment, the second surface 31 is round, and a number of the at least one second side surface 32 is one. In other words, the second side surface 32 is an annular wall surface surrounding the second surface 31 and connected to the edge of the second surface 31. Meanwhile, the accommodating recess 302 can be an annular recess, and the cable 40 surrounds the base 30 when accommodated in the accommodating recess 302.

The base 30 preferably has at least one positioning bump 33 for ease of fixing the cable 40. The at least one positioning bump 33 is formed in the accommodating recess 302 to clamp the cable 40.

The base 30 has multiple second through-holes 310 and multiple second lateral openings 320. The second through-holes 310 are formed on the second surface 31, and the second inner space 301 of the base 30 is in gaseous communication with the first inner space 100 of the main casing 10 via the second through-holes 310. In the preferred embodiment, the second lateral openings 320 are located in the accommodating recess 302, but not limited thereto.

Figure 6:
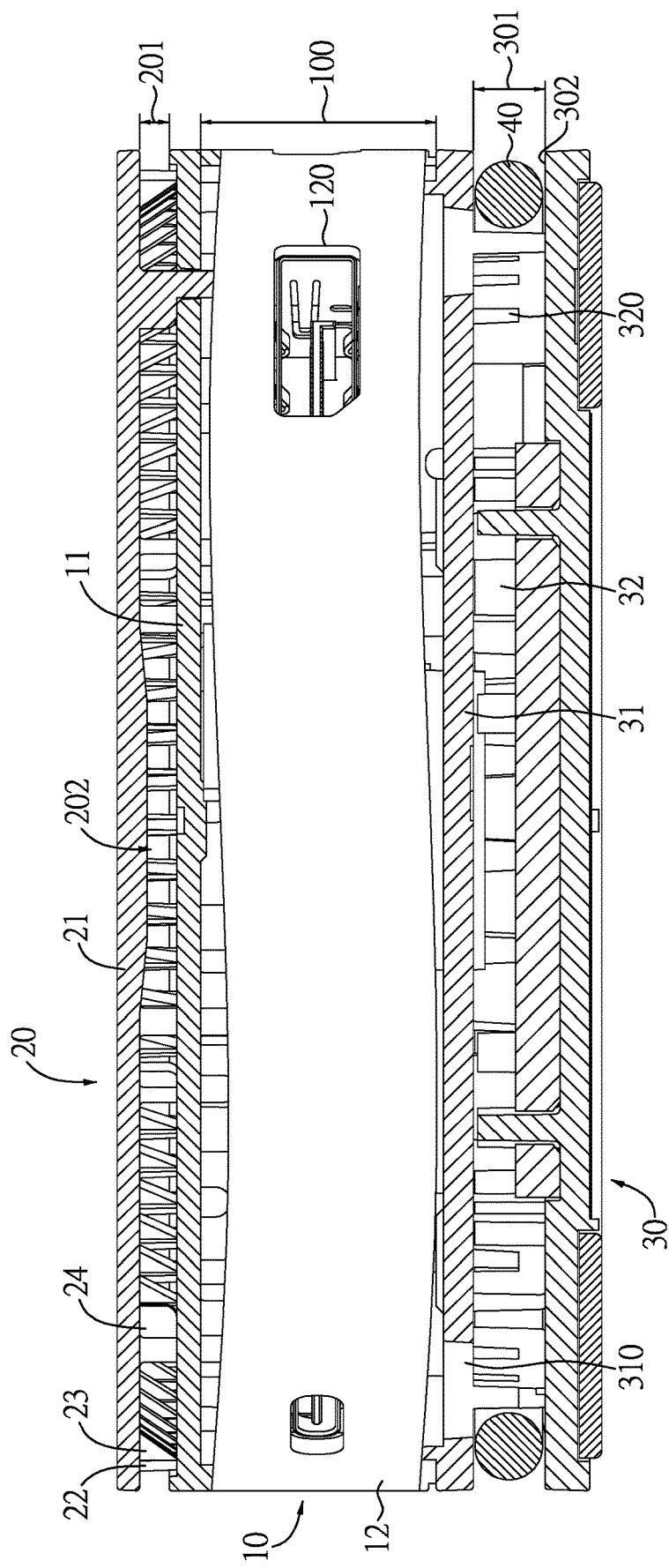
FIG. 6 is a sectional view of the docking station, showing the docking station cut across a cutting plane line 6-6 in FIG. 4.
Figure 7:
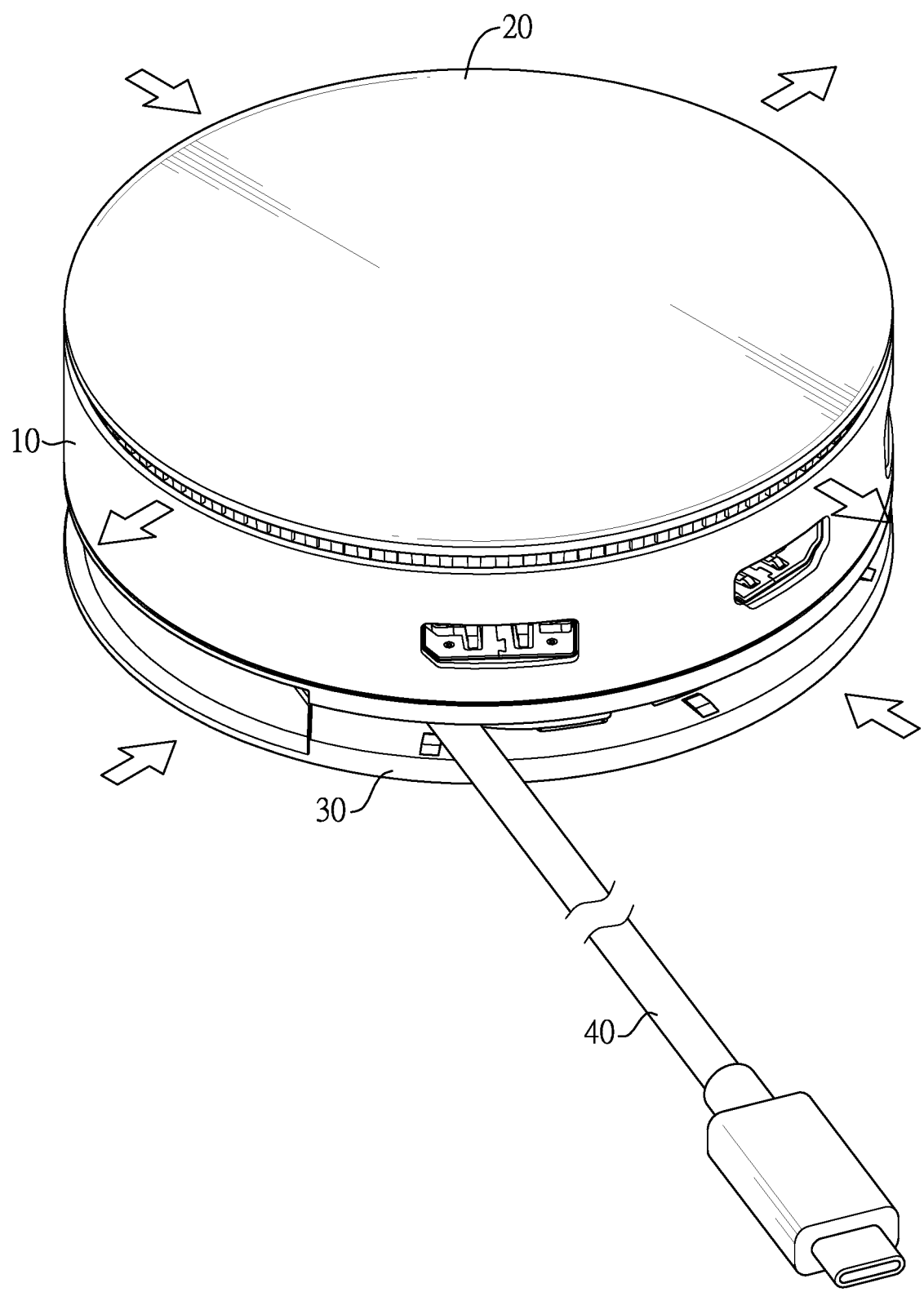
FIG. 7 is a perspective view of the docking station in FIG. 1, showing an operating status of the present invention.

With reference to FIGS. 5 to 7, according to the aforementioned structure, when the docking station is in use, first pull out the cable 40 of the docking station and connect the cable 40 to one of the electronic devices, and then connect another one of the electronic devices to one of the connecting holes 120.

The electronic components inside the docking station generate heat when a signal is transmitted between said electronic devices, and the heat makes air inside the second inner space 301 flow upwards via a part of the second through-holes 310 into the first inner space 100. The air inside the first inner space 100 flows upwards via a part of the first through-hole 110 to the ventilation layer 201 and subsequently exits the docking station via a part of the first lateral openings 202.

Meanwhile, convective air enters the ventilation layer 201 via the other part of the first lateral openings 202, then flows downwards into the first inner space 100, and then even further flows downwards into the second inner space 301 via the second through-holes 310.

Moreover, cool air enters the second inner space 301 via the second lateral openings 320. Said cool air absorbs the heat in the docking station and then passes through the first inner space 100, the ventilation layer 201 in order, and finally exits the docking station via the first lateral openings 202.

As a result, natural air convection paths are formed inside the docking station to dissipate the heat, which is generated by the electronic components in the docking station, away from the docking station.

Moreover, by forming the multiple first through-holes 110 and the multiple first lateral openings 202, the natural air convection paths simultaneously include some paths entering the docking station and other paths exiting the docking station. Therefore, temperature of the exterior surface of the docking station and temperature of the electronic components inside can be reduced effectively.

Additionally, hot air exits the docking station via the first lateral openings 202 after entering the ventilation layer 201 such that heat can be dispersed while being dissipated. As a result, heat can be distributed evenly on the covering plate 21 above the ventilation layer 201, thereby preventing a part of the covering plate 21, which is adjacent to the electronic components, from being overheated. Meanwhile, a material of the main casing 10 can be metal while a material of the cover body 20 can be plastic to further prevent heat from reaching the external surface of the cover body 20 before being equalized.

Even though numerous characteristics and advantages of the present invention have been set forth in the foregoing description, together with details of the structure and features of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. A docking station, configured for being connected to an electronic device and having
    a base;
    a main casing fixed to the base; a first inner space formed in the main casing; the main casing having
        a first surface;
        multiple first through-holes formed on the first surface and in gaseous communication with the first inner space; and
        at least one first side surface; each one of the at least one first side surface connected to an edge of the first surface; each one of the at least one first side surface having
            at least one connecting hole formed therethrough; each one of the at least one connecting hole used for being connected to the electronic device;
    a cover body fixed on the first surface and having
        a covering plate covering the first surface; the covering plate parallel to and disposed apart from the first surface, wherein a ventilation layer is formed between the covering plate and the first surface; the ventilation layer being in gaseous communication with the first inner space of the main casing via the first through-holes; and
        multiple connecting rods; each one of the connecting rods having
            a first end fixed to the covering plate; and
            a second end fixed to the main casing; and
        multiple first lateral openings formed on the cover body and in gaseous communication with the ventilation layer, wherein each one of the first lateral openings is formed among the covering plate, the first surface of the main casing, and two adjacent ones of the connecting rods.

2. The docking station as claimed in claim 1, wherein the cover body has multiple reinforcing ribs located in the ventilation layer; each one of the reinforcing ribs is connected to the covering plate and one of the connecting rods.

3. The docking station as claimed in claim 1, wherein the cover body has at least one parting member located in the ventilation layer; the covering plate and the first surface of the main casing are disposed apart by the at least one parting member.

4. The docking station as claimed in claim 2, wherein the cover body has at least one parting member located in the ventilation layer; the covering plate and the first surface of the main casing are disposed apart by the at least one parting member.

5. The docking station as claimed in claim 3, wherein each one of the at least one parting member has
    a positioning portion having
        a first end fixed to the covering plate; and
        a second end mounted through the first surface; and
    a laterally extending portion connected to the positioning portion and having
        a first side connected to the covering plate; and
        a second side abutting against the first surface of the main casing.

6. The docking station as claimed in claim 4, wherein the at least one parting member has
    a positioning portion having
        a first end fixed to the covering plate; and
        second end mounted through the first surface; and
    a laterally extending portion connected to the positioning portion and having
        a first side connected to the covering plate; and
        a second side abutting against the first surface of the main casing.

7. The docking station as claimed in claim 1, wherein a distance between the covering plate and the first surface ranges from 1 millimeter to 5 millimeters.

8. The docking station as claimed in claim 6, wherein a distance between the covering plate and the first surface ranges from 1 millimeter to 5 millimeters.

9. The docking station as claimed in claim 1, wherein the base has
    a second surface; and
    at least one second side surface; each one of the at least one second side surface connected to an edge of the second surface.

10. The docking station as claimed in claim 8, wherein the base has
    a second surface; and
    at least one second side surface; each one of the at least one second side surface connected to an edge of the second surface.

11. The docking station as claimed in claim 9, wherein a second inner space is formed in the base, and the base has:
    multiple second through-holes formed on the second surface; the second inner space in gaseous communication with the first inner space of the main casing via the second through-holes; and
    multiple second lateral openings formed on the at least one second side surface and in gaseous communication with the second inner space.

12. The docking station as claimed in claim 10, wherein a second inner space is formed in the base, and the base has:
    multiple second through-holes formed on the second surface; the second inner space is in gaseous communication with the first inner space of the main casing via the second through-holes; and
    multiple second lateral openings formed on the at least one second side surface and in gaseous communication with the second inner space.

13. The docking station as claimed in claim 9, wherein the second surface is round;
    a number of the at least one second side surface is one; the second side surface surrounds the second surface and is connected to the edge of the second surface;
    the base further has
        an accommodating recess being an annular recess formed on the second side surface; and
    the docking station further has
        a cable selectively accommodated in the accommodating recess; the cable surrounding the base when accommodated in the accommodating recess.

14. The docking station as claimed in claim 12, wherein the second surface is round;

a number of the at least one second side surface is one; the second side surface surrounds the second surface and is connected to the edge of the second surface;

the base further has
an accommodating recess being an annular recess formed on the second side surface; and the docking station further has
a cable selectively accommodated in the accommodating recess; the cable surrounding the base when accommodated in the accommodating recess.

15. The docking station as claimed in claim 1, wherein the base further has
an accommodating recess;
at least one positioning bump formed in the accommodating recess;

the docking station further has
a cable selectively accommodated in the accommodating recess; the cable clamped by the at least one positioning bump when accommodated in the accommodating recess.

16. The docking station as claimed in claim 14, wherein the base further has
at least one positioning bump formed in the accommodating recess; the cable clamped by the at least one positioning bump when accommodated in the accommodating recess.

17. A docking station, comprising:
a base;
a main casing disposed at a top of the base;
a first inner space formed in the main casing;
the main casing having a first side surface having multiple through holes; the through holes being of various shapes for allowing various external connectors to be plugged therethrough;
a cover disposed at a top of the main casing and having a top plate covering at least a portion of the top of the main casing; and
multiple rod-shaped structures;
each one of the rod-shaped structures having a first end fixed with the top plate and a second end fixed to the main casing;
wherein, the top plate is spaced apart vertically from the main casing by the rod-shaped structures for forming a ventilation layer therebetween; the ventilation layer being in gaseous communication with outside space via multiple first lateral openings, each of the multiple first lateral openings being defined by two adjacent ones of the rod-shaped structures.

18. The docking station as claimed in claim 17, wherein the base has
a base plate spaced apart from the main casing and forming a second inner space therebetween; and
a second side surface having multiple second lateral openings for allowing the second inner space in gaseous communication with outside space.

* * * * *